United States Patent
Herzer et al.

(10) Patent No.: US 6,741,116 B2
(45) Date of Patent: May 25, 2004

(54) SEMICONDUCTOR COMPONENT FOR DIRECT GATE CONTROL AND MONITORING OF POWER SEMICONDUCTOR SWITCHES

(75) Inventors: Reinhard Herzer, Ilmenau (DE); Jurgen Masannek, Nuremberg (DE); Jan Lehmann, Ilmenau (DE)

(73) Assignee: Semikron Elekronik GmbH, Nuremberg (DE)

(*) Notice: Subject to any disclaimer, the term of this patent is extended or adjusted under 35 U.S.C. 154(b) by 0 days.

(21) Appl. No.: 10/272,493

(22) Filed: Oct. 15, 2002

(65) Prior Publication Data
US 2003/0085750 A1 May 8, 2003

(30) Foreign Application Priority Data
Oct. 15, 2001 (DE) .......................... 101 50 832

(51) Int. Cl.[7] ............................. H03K 17/687
(52) U.S. Cl. .................. 327/434; 363/40; 363/56.2
(58) Field of Search ................. 327/434, 435, 327/436, 437, 427; 363/40, 56.2, 98, 127, 132, 56, 95

(56) References Cited

U.S. PATENT DOCUMENTS 5,369,563 A * 11/1994 Miller .................... 363/56.03
5,585,704 A * 12/1996 Elzind .......................... 318/446
5,777,864 A *  7/1998 Seong et al. ................... 363/98

* cited by examiner

Primary Examiner—Tuan T. Lam
Assistant Examiner—Hiep Nguyen
(74) Attorney, Agent, or Firm—Darby & Darby

(57) ABSTRACT

A semiconductor component performing interface functions between the controller and the power components of a power inverter, is designed for the control of semiconductor components, in particular for the control of IGBT (Insulated Gate Bipolar Transistor) and MOSFET (Metal Oxide Semiconductor Field Effect Transistor) power switches in different circuit topologies for intermediate and high power capacity. The component carries a monolithically integrated circuit performing the functions of signal processing (12), level transformation (13, 14), gate driver amplification, generation and monitoring of operating voltages, short-circuit monitoring by means of collector-emitter voltage detection, as well as the processing, storing and transmission of error signals for a power semiconductor switch.

12 Claims, 8 Drawing Sheets

SEMICONDUCTOR COMPONENT FOR DIRECT GATE CONTROL AND MONITORING OF POWER SEMICONDUCTOR SWITCHES

BACKGROUND OF THE INVENTION

The invention relates to a semiconductor component with interface functions between the controller and the power components of power inverters, suitable for the control of semiconductor components, in particular for the control of IGBT (Insulated Gate Bipolar Transistor) and MOSFET (Metal Oxide Semiconductor Field Effect Transistor) power switches.

Hybrid control circuits are well-known from the state of the art. In "Applikationsbuch IGBT- und MOSFET- Leistunsmodule" (Applications Book for IGBT and MOSFET Power Modules (ISBN 3-932633-24-5) as well as in the catalog '99 of SEMIKRON Electronics GmbH, circuit arrangements of this kind are described for the control of semiconductor power switches. In the following, the problems involved in controlling these elements will be discussed on the basis of block diagrams.

FIG. 1 represents the principal structure of a power electronics system for the control of high voltage IGBTs according to the state of the art. In detail, the power electronics system consists of:

- a controller (1) with, e.g., a microprocessor, memory and A/D and/or D/A converter,
- a control circuit (2) with digital—, analog—and power components for signal processing as well as power supply and error processing,
- a separation (3) between the low and high voltage parts,
- the driver circuit (4) with power supply, gate driver and monitoring elements,
- the intermediate circuit (5),
- the power switches (6),
- a consumer device (7), and
- sensors with signal-processing circuits (8).

The connection to the power semiconductor switches is illustrated through a partial representation of an inverter circuit showing two IGBTs of a half bridge, the intermediate circuit of the converter, and the consumer device (symbolically represented by a motor).

Sensors (which may include signal-processing circuits) for all relevant operational variables are used to acquire the characteristic operating variables of the consumer device and of the power switches (e.g. rpm rate, position, torque of the consumer device, and temperature, current, and short-circuit condition of the power switches) and to transmit the values of the variables to the control circuit or the controller to generate the corresponding data for determining the operating state of the converter during its operation.

Semiconductor technologies are now available for low-voltage applications (e.g. applications in batteries, applications in automobiles with intermediate circuit voltages smaller than 100V, so that controller circuits, control- and driver circuits as well as circuits for the separation between potentials and for the acquisition of data characterizing an operating state can to a large extent be monolithically integrated. With higher intermediate circuit voltages, the integration of the separation of potentials (and/or level converter stage) becomes more and more difficult because of isolation problems. At the current state of the art, solutions are available for the integration of level-converter stages up to 600V and recently also up to 1200V. They are described in International Rectifier Data Sheets IR2130 and IR2235. The advantages of these solutions lie in their high degree of integration and the associated cost savings. The drawbacks of these solutions lie in the restricted voltage range and the limited driver power which decreases if voltage range is increased, and in the sensitivity to interference in a rough electromagnetic environment.

Applications possibilities for this technology are limited because of the required bootstrap power supply and the lack of a true galvanic separation, which represents a severe disadvantage of the existing state of the art. For intermediate and high power levels, it is therefore necessary to use additional opto-couplers, transmitters or post-amplifiers.

A monolithic integrated potential separation is made possible only by using dielectric isolation technologies, as for example an auxiliary carrier technology that has been described by C. Y. Lu (IEEE Trans. On E.D. ED 35 (1998), pp. 230–239), by wafer bonding with trench isolation according to K. G. Oppermann & M. Stoisiek (ISPSD 1996, Proc. S. 239–242) and/or by the SIMOX technology according to Vogt et al (ISPSD 1997, Proc. pp. 317–320). These technologies are limited to isolation voltages of less than 1200 V (in most cases less than 600 V) because of the realizable oxide thicknesses of less than 2 $\mu$m, and they are furthermore very cost-intensive.

In practice, for voltages above 100V, discrete opto-couplers or transmitters are used for the potential separation between the low and high voltage side. The advantage of transmitters in comparison to opto-couplers lies in the bi-directional data flow for control signals and/or error signals. In addition, a power transmission with a floating potential for the current supply of the high voltage side is possible only with transmitters.

If discrete opto-couplers or transducers are used, it is necessary to use separate, discrete or integrated circuits both on the low and high voltage side. In certain cases (e.g., at low power levels and with few analog functions), a monolithic integration of the functions of the low-voltage side with the controller is possible.

Another possibility according to the state of the art is offered by the hybrid integration circuit of opto-coupler components with an integrated circuit including driver- and monitoring functions (on the high voltage side) in a special housing (Hewlett-Packard Data Sheet HCPL-316, December 1997). In this case, a high degree of integration is realized for high voltages (from 600V to 1200V), as well as suitability for intermediate and high power levels.

The only discrete components that have to be added to the driver circuit are the high voltage diode for the monitoring of the votage between collector and emitter (VCE), because of a possible short-circuit at the IGBT, the current supply for the high voltage side and some difficult-to-integrate passive components and/or elements for optional functions.

In hybrid IGBT control circuits with galvanic separation of the primary side by means of opto-couplers, a fast coupler is used for the signal path, and usually a second, slower coupler to return the error signal.

For the monitoring of the VCE and the supply voltage on the high voltage side (secondary side), integrated components (Motorola Data Sheet MC 33,153) are already available. The secondary, floating voltage supply is realized with a DC/DC converter because of the higher power requirement. The stabilization of the supply voltage is usually made through a longitudinal regulator circuit. For the voltage supply of the secondary side with a DC/DC converter, the three BOTTOM switches of a three-phase-current half-bridge circuit can generally be combined into a voltage supply.

According to the state of the art, the functions of the low-voltage side (as for example signal processing, error processing, current supply) are realized by using discrete elements, or in particular the digital functions are taken over by the controller.

In DE 198 51 186, a circuit arrangement is proposed, where all functions of the primary side for the control, monitoring and current supply of power components (MOSFET or IGBT) are realized in a three-phase bridge circuit for an intermediate power range. This integrated circuit must perform all interface functions between the controller as well as the six drivers and the IGBT switches of the high voltage side. According to the state of the art, opto-couplers (for control signals) are used for the potential separation of the secondary side (high voltage side), and for the driver- and monitoring functions on the secondary side, one circuit is used for each power switch.

In DE 100 14 269.9, a circuit arrangement is proposed, where the level transformation as well as the driver- and monitoring functions of the 3 BOTTOM switches of the respective three IGBT half-bridges as well as an additional seventh switch are combined, so that the result is a monolithically integrated quadruplex gate driver IC. This driver IC for 4 semiconductor switches is on the same potential as the primary control IC and the controller. A common potential of the BOTTOM switches with the control circuit and the controller is possible only under the condition that the interference voltages caused by parasitic effects in the system are relatively small. This is the case in power components for low and intermediate power levels (voltage up to 1200V, current smaller than 150 A per switch) and in three-phase bridge circuit modules of a very compact design, where the internal inductances and resistors can be kept very small. Depending on the switching state, the separate driver stages of the 3 TOP switches of the respective three half bridges can be at the positive intermediate circuit voltage (e.g., 300V . . . 1200V DC). For reasons of isolation, they need to have potential separation (e.g. by means of opto-couplers).

OBJECT OF THE INVENTION

The present invention has the objective to provide a monolithically integrated semiconductor component for a direct gate control and monitoring of a semiconductor switch in a an inverter circuit.

SUMMARY OF THE INVENTION

A semiconductor component for the control of a power semiconductor switch in a power inverter, as proposed by the present invention to meet the foregoing objective, has a monolithically integrated circuit arrangement of functional blocks that are operable to perform all of the following functions for the power semiconductor switch:

input interface with Schmitt trigger,
pulse flank memory,
multiple level transformation,
start-up logic with voltage-controlled power on reset,
driver logic,
gate driver for switching-on of the power semiconductor switch,
gate driver for switching-off of the power semiconductor switch,
gate driver for gentle switching-off of the power semiconductor switch,
internal generating and monitoring of an operating voltage and reference voltage,
short-circuit monitoring of the power semiconductor switch by dynamic collector-emitter voltage detection,
error detection/storage and driver for transmission of the error signal to a primary side of the semiconductor component.

BRIEF DESCRIPTION OF THE DRAWINGS

The detailed description of the invention, which follows below, makes reference to the attached drawings, wherein.

DETAILED DESCRIPTION OF THE INVENTION

Figure 1:
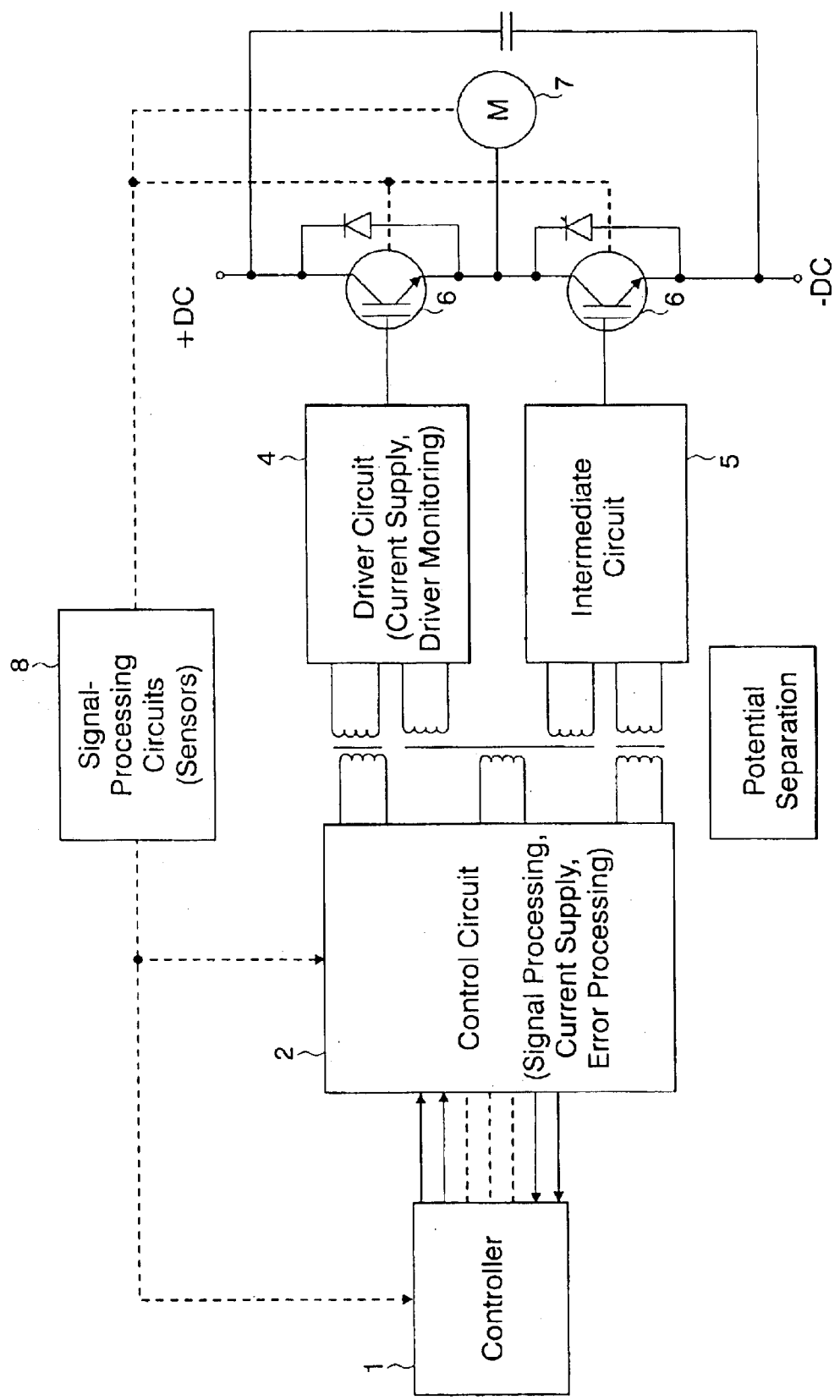
FIG. 1 represents the principal structure of a power electronics system for the control of high voltage IGBTs according to the state of the art.
Figure 2:
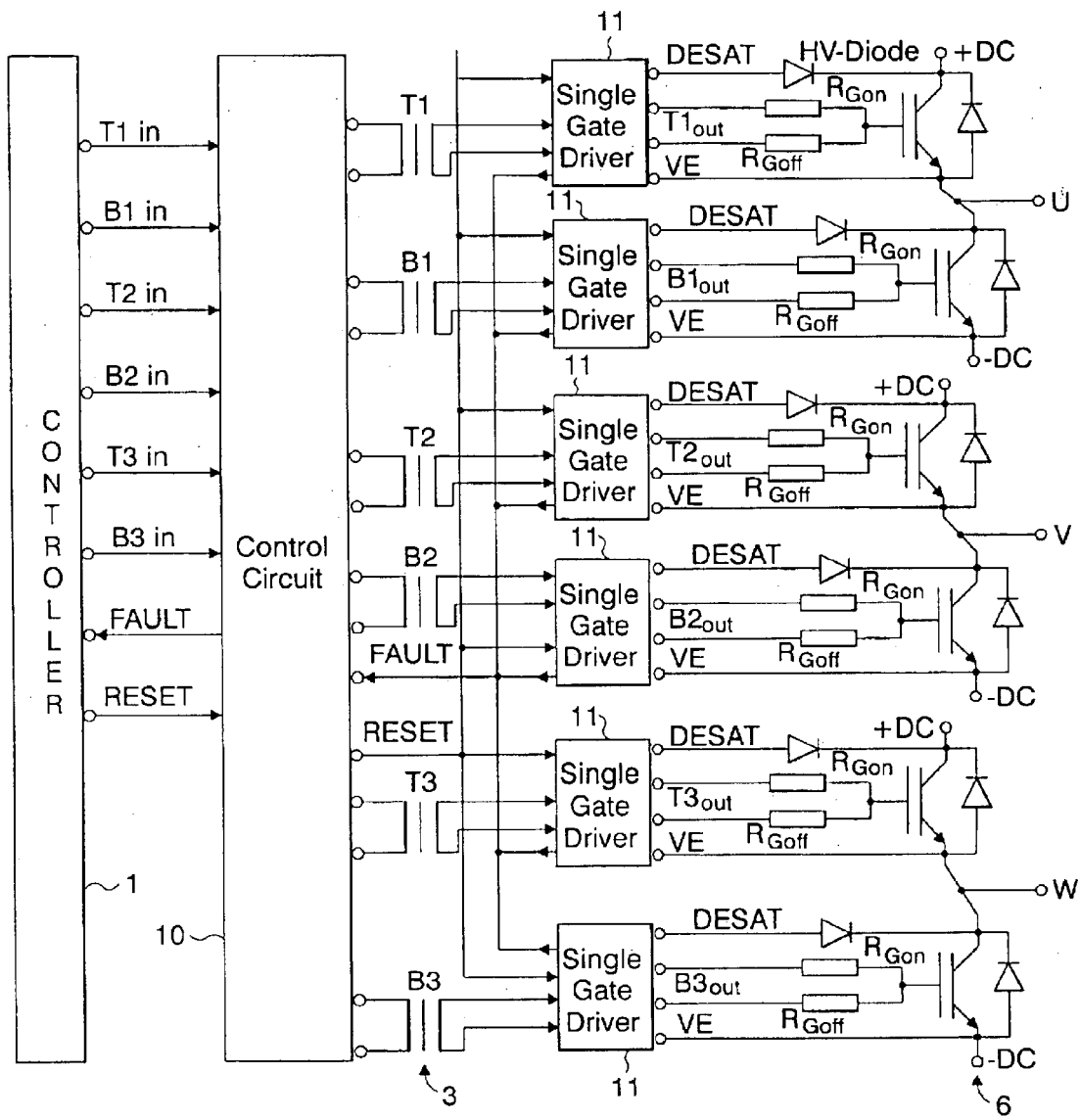
FIG. 2 illustrates an example where the invenive component is used with a three-phase bridge circuit.

The inventive semiconductor component will be explained through the example of a three-phase bridge circuit (FIG. 2). It can be described as a single gate driver IC (11) with input interface, level transformation as well as driver and monitoring functions, which can be universally used for the control of the Top und BOTTOM switches. The separate driver stages of the 6 switches used in the example can be at the maximum positive intermediate circuit voltage (e.g., +300V . . . +1700V DC).

For reasons of isolation, the switches need to have potential separation, e.g., by means of transmitters (3). The control system in FIG. 2 further includes a controller (1) and a control circuit (10) on the primary side.

Figure 3:
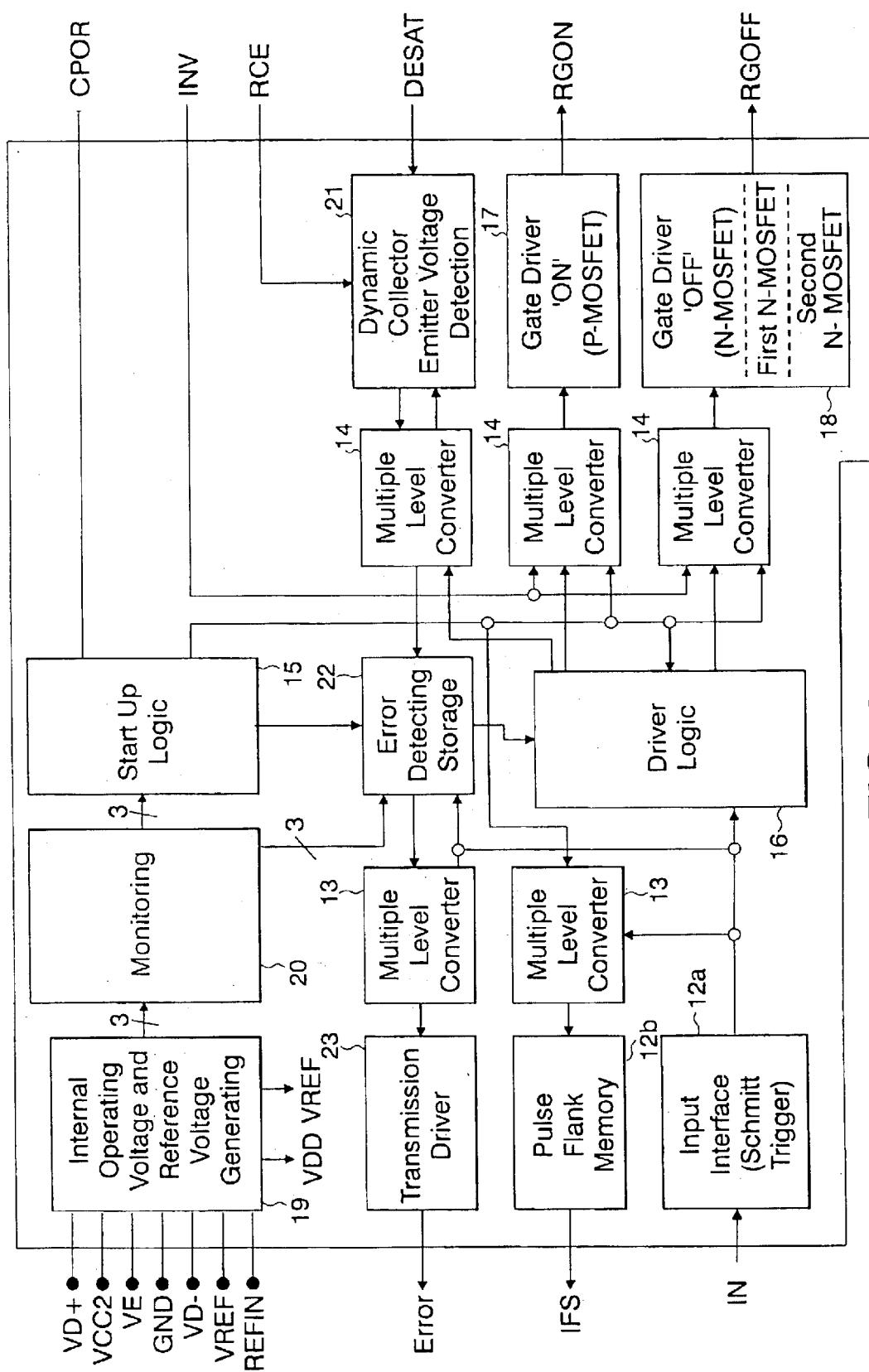
FIG. 3 represents a block schematic of the inventive semiconductor component.

The inventive solution for a single-gate driver IC will be explained through the block schematic of FIG. 3, which contains the most important circuit parts, functions, connections as well as inputs and outputs of the semiconductor component.

An example of a semiconductor component is presented, which was realized in a CMOS high voltage technology, in which the following IGBT gate driver functions are implemented:

Input interface with Schmitt trigger (12a)
Pulse flank memory (12b)
Multiple level transformation (13, 14)
Start-up logic (voltage-controlled power on reset—POR) (15)
Driver logic (16)
Gate driver for switching-on of the IGBT (17)
Gate driver for switching-off of the IGBT (18)
Gate driver for "gentle" (slow) switching-off of the IGBT (18)

internal operating voltage and reference voltage generation (19) and -monitoring (20)

Short-circuit monitoring of the IGBT by dynamic collector-emitter voltage detection (21)

Error detection/storage (22) and driver for transmission of the error signal to the primary side (23).

The symbols shown at the individual inputs and outputs have the following meanings:

| | |
|---|---|
| VD+ | operating voltage for switching-on of the IGBT, usually 15 V |
| VCC2 | operating voltage 15 V (for logic) |
| VE | emitter potential of the IGBT |
| GND | IC-internal reference potential |
| VD− | operating voltage for switching-off of the IGBT, variable between 0 V. . . . −15 V |
| VREF | connection for tapping-off of the internal reference potential for the saturation-voltage monitoring |
| REFIN | input for external reference voltage |
| ERROR | output of error memory |
| IFS | pulse flank memory |
| IN | control input with Schmitt trigger characteristic |
| CPOR | control of the power-on-reset, tapping-off of the internal supply voltage |
| INV | input for the inversion of the driver outputs RGON and RGOFF |
| RCCE | control of the dynamic saturation voltage monitoring |
| DESAT | input of the dynamic saturation voltage monitoring |
| RGON | output of driver RGON |
| RGOFF | output of driver RGOFF |

The range of functions of the single-gate driver IC is aimed at providing universal applicability in IGBT und MOSFET drivers in a large diversity of voltage- (50V . . . 1700V) and power classes. Through a proper selection of the size and power capacity of the integrated gate driver stages, it is possible to control IGBTs from few ampere to several hundred ampere. For still higher power levels, it is possible to arrange external power-MOSFETs after the separate outputs for the switching-on (RGON) and switching-off (RGOFF) functions. In the latter case, the output signals at RGON and RGOFF are inverted by way of the control input INV.

For the switching-off of the power semiconductors, a freely selectable negative cutoff voltage VD− can be used in the range between 0V and −15V.

At the input side, circuit components are incorporated in the IC, which allow a direct coupling of a pulse transmitter as well as the use of opto-couplers and/or light-wave conductors for a true potential separation.

Operating-voltage Supply

The integrated circuit operates on three supply voltages and one reference voltage. The supply voltages VD+ (e.g., +15V) and VD− (e.g., −15V) (relative to the emitter potential VE of the IGBT) need to be made available externally. Both terminals are directly connected to the IC-internal ON- and OFF driver stages.

The potential at the terminal VCC2 should be identical to the potential at the terminal VD+. Likewise, the potential of the terminal GND should be identical to the potential at the terminal VD−. Providing separate terminals for VCC2 and GND serves to uncouple the IC-internal analog and digital circuit components of the driver stages.

Generating VDD/VREF (19)

The operating voltage for the supply of the IC-internal logic components is generated in the ASIC (Application-Specific Integrated Circuit) from the potentials at VCC2 and GND and is supported at the terminal CPOR by a capacitor. This voltage is, e.g., +5V relative to GND and VD+.

The reference voltage required for the VCE (+10V) is generated internally and can be stabilized at the terminal VREF by a capacitor. Optionally, another reference or a more accurate external reference (relative to the potential at the terminal VE) can be connected to the terminal REFIN.

The signal path of the integrated circuit consists of the components input interface (12a), pulse flank memory (12b), driver logic (16), level transformation (13, 14), and driver stages (17, 18).

Input Interface (12a, 12b)

The input interface IN is a CMOS- and TTL-compatible input with a Schmitt-trigger characteristic for the use of opto-couplers and/or light-wave conductors. Short pulses are suppressed in order to improve the safety against interference.

By means of an external connection of the input IN with the output IFS the input interface becomes the pulse flank memory (12b). Over an external series resistor, an impulse transmitter can be connected directly to the ASIC. The objective in the dimensioning of the pulse flank memory is to achieve a switch hysteresis of at least 20V (+10V for the switching-on and −10V for the switching-off of the IGBT. The reference potential is GND).

Driver Logic (16), Level Converter (13, 14)

The Driver logic (16) establishes the logic relationship between the input signal and the error memory and ensures that the IGBT will switch off on its own after an error has been detected (short-circuit, UB error), without the need for the pulse flank memory to change its condition. In addition, the signal path in the driver logic is interrupted during the Power-On-Reset phase. The level converters (14) that follow in the direction towards the drivers (17, 18) perform a level shift from +/−5V to +/−15V.

Drivers (17, 18)

The drivers (17, 18) are in the example are implemented in MOS technology, and it makes sense to integrate them up to a peak output current of two to three ampere. The drain connections of the two power transistors (NMOS and PMOS) are taken separately to the outside as terminals RGON and RGOFF, so that it becomes possible to use separate series resistors $R_{GON}$ and $R_{GOFF}$ ahead of the gates. If higher levels of control power are needed (e.g., for large IGBT with current ratings above 150A), external power MOSFETs can be put in series after the internal driver stages. The levels at the IC exits RGON and RGOFF are inverted in this case through the code input INV (INV at GND).

As an option, additional n-MOSFET-drivers can be provided for a "gentle" (slow) switching-off in case of a short-circuit. They have only a fraction (e.g., a tenth) of the current capacity of the driver stages for the "hard" (fast) switching-off. The gentle switching-off avoids, e.g., excessive voltage peaks, oscillations, and dynamic loads which could be large enough to destroy the IGBT. During the gentle switching-off of the power semiconductor switch, the gate voltage is monitored, and when it has fallen below a defined threshold value, the continuation of the switching-off process is shortened by changing to the "hard" switch-off mode.

VCE—Monitoring (21)

Short-circuits of the power switches and/or in the load circuit are detected through a saturation-voltage monitoring arrangement at the collector of the IGBT. The collector potential is tapped off by way of a high voltage diode (see FIG. 2) and its magnitude vs. time is evaluated in the IC. (IC input DESAT).

The $V_{CE}$ detection is triggered by way of the control signal (signal of the pulse flank memory). The $V_{CEsat}$ detection (threshold value $V_{CEsat}$ and $t_{min}$) is selected by way of the pin RCCE by means of an external resistor $R_{CE}$ and an external capacitor $C_{CE}$. (The threshold value $V_{CEsat}$ is the level below which the voltage $V_{CE}$ will not fall (e.g., 7V) within a certain time $t_{min}$ due to the loss of saturation of the IGBT in case of a short circuit. In the absence of a short circuit, $V_{CE}$ will fall clearly below this threshold in the switched-on state.)

The reference voltage VREF of the $V_{CE}$-detection is generated internally and can be stabilized at the pin VREF by means of an external capacitor.

For higher precision, an external reference source of the desired accuracy can be connected to the pin VREF.

In case of a $V_{CE}$ error, the IGBT is switched off immediately (fast switch-off). Optionally, it is also possible in case of a short circuit, to use the "gentle" (slower) switch-off mode on the IGBT by means of an OFF driver of lower power capacity.

Monitoring of the Operating Voltage (20)

The monitoring of the operating voltage consists of three partial circuits, each of which monitors a specific supply voltage. Moreover, the duration of the power-on-reset is derived from the results of monitoring the operating voltage.

The VCC2-monitoring ensures that the IGBT is still switched on with a borderline-permissible gate-emitter voltage $V_{GE(on)}$; otherwise the switching-on of the IGBT is inhibited.

The threshold below which a UB error is to be signalled lies typically at 12, 7V for a swithing-on voltage of 15V. If the switching-on voltage is, e.g., 10V (MOSFET applications), the UB error threshold is approximately 8V.

The VDD monitoring checks the internally generated supply voltage VDD of 5V. The under-voltage threshold should be at least 4V.

The VREF monitoring checks the 10V reference voltage of the VCE detection.

Power-On-Reset (15)

The partial circuit POR has the purpose to safely prevent that the IGBT is switched on during the build-up of the operating voltages and to initialize the error memory and the pulse flank memory. The Power-On-Reset signal is generated under voltage control, based on the evaluation of the monitored signals of all three operating voltages.

The circuit component POR consists in principle of an RS flip-flop that is reset during the Power-On-Reset phase and is set after a specific length of time. The length of time depends on the build-up speed of all supply voltages and of the reference voltage. The Power-On-Reset phase is terminated, after an error-free condition has been signalled from all of the UB monitoring locations.

The POR signal acts with the highest priority on the error memory and intervenes directly in the signal path at the level converter stages and at the driver logic.

The following events cause the flip-flop (FF) to be reset and then set:
1. Reset (POR begins): The VDD monitoring detects an error during the build-up of the operating voltage. The flip-flop is reset in a defined manner.
2. Set (POR terminated): All monitoring results of the operating voltages must be error-free, before the FF is set.

Error Memory and Error Transmission (22, 13, 23)

The error memory (22) serves to store detected errors ($V_{CE}$ detection, monitoring of operating voltage). The setting of the error memory is signalled at the output labeled ERROR in FIG. 3. The error memory is set in the following error cases (with a logic OR relationship between the different cases).

1. Error signal from the $V_{CE}$ detection
2. Error signal from the monitoring of VCC2
3. Error signal from the monitoring of VDD
4. Error signal from the monitoring of VREF The error memory is reset as a consequence of the following:
1. by the Power-on-Reset
2. by an internally generated resetting signal.

A signal for resetting is generated internally, if the following conditions are met:
1. A valid switching-off signal has been received from the primary side, which signifies that the pulse flank memory in the OFF state.
2. No operating-voltage errors are present.

Accordingly, a detected $V_{CE}$ error is always reset after the switch-off pulse has been received from the primary side. In contrast, UB errors remain stored in the error memory, as long as the error cause is present.

The state of the error memory (22) is signalled through the circuits 13 (level transformation) and 23 (driver) to the output terminal labelled ERROR. The internal structure of the circuit is laid out in such a way that transmitters as well as opto-couplers and light-wave conductors are connected to and can be operated from the output terminal labelled ERROR (MOS power stage with $I_{out}$ [peak] of approximately 1 ampere). It is advantageous to use transmitters, because they can transmit bidirectionally, i.e., control signals in the forward direction as well as error signals in the return direction. Therefore the further discussion relates primarily to the use of transmitters.

The output labelled ERROR is connected with the impulse transmitter by way of a capacitor. In the event of an error, a positive pulse (relative to the secondary side) is generated at the pulse transmitter. The generation of the error signal may take place only in a specific time window, to prevent that the error signal is transmitted by the pulse flank memory as a switching-on pulse (likewise a positive pulse) or during the off-period of the primary side.

For this reason the output labelled ERROR is triggered by the $V_{CE}$ detection, and the change at the ERROR output from low to high cannot occur until after a defined time interval has elapsed following a valid switching-on pulse. The time interval $t_{min}$ is set by means of an external capacitor and an external resistor at the IC input terminal RCCE. These external elements belong to the dynamic $V_{CE}$ detection.

Coupling of the time window for transmitting the error signal to the $V_{CE}$ detection ensures that a UB error occurring at any time can be transmitted only during a time window in which the error detection on the primary side is active.

Figure 4:
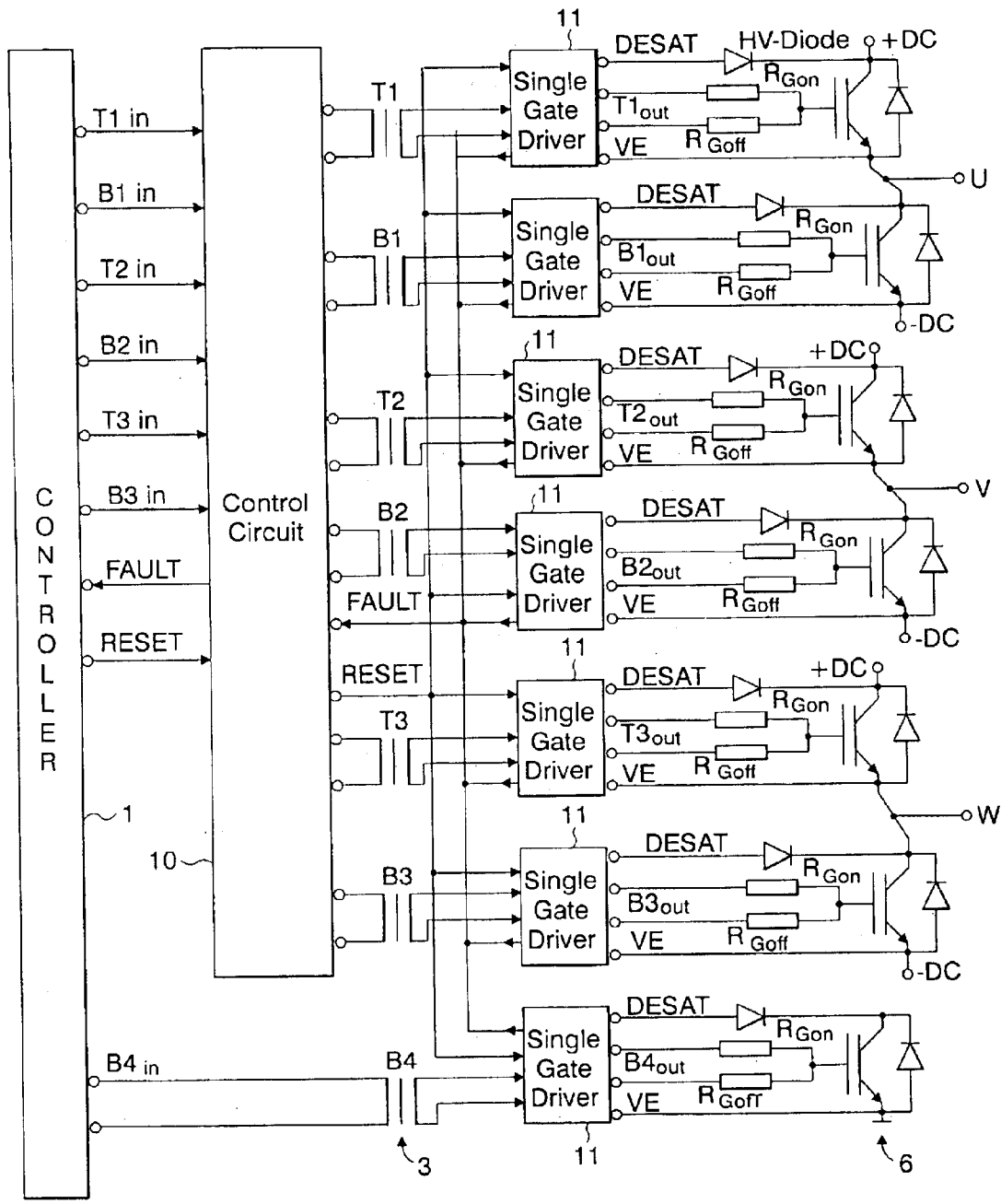
FIG. 4 illustrates an embodiment where the three-phase bridge circuit of FIG. 2 is supplemented by an additional seventh switch.

FIG. 4 illustrates a further embodiment, wherein the three-phase bridge circuit of FIG. 2 is supplemented by an additional seventh switch, which can be used as brake setter or to improve the reactive power (phase) properties.

Figure 5:
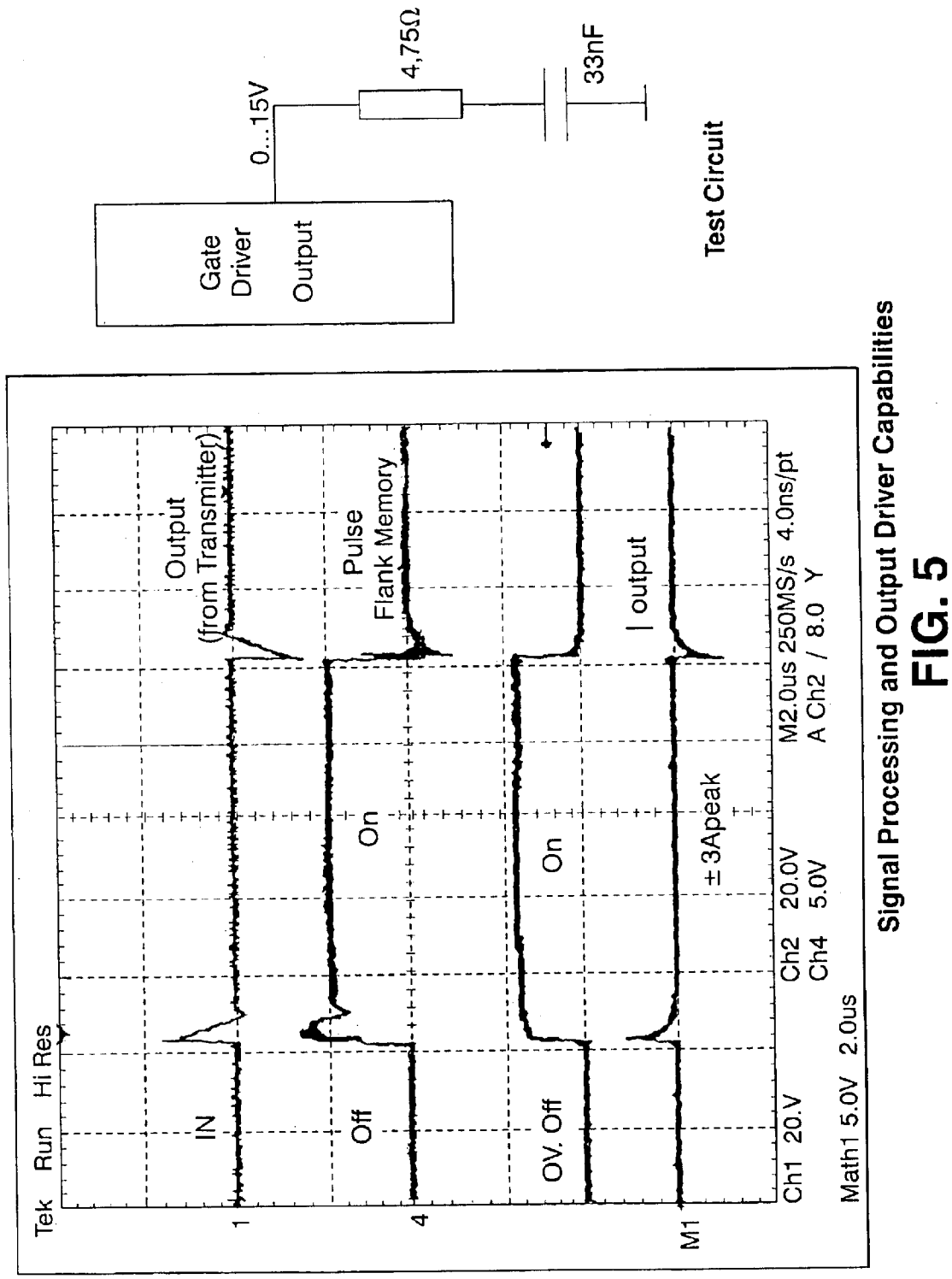
FIG. 5 illustrates signal processing and output driver capabilities of the inventive semiconductor component.
Figure 6:
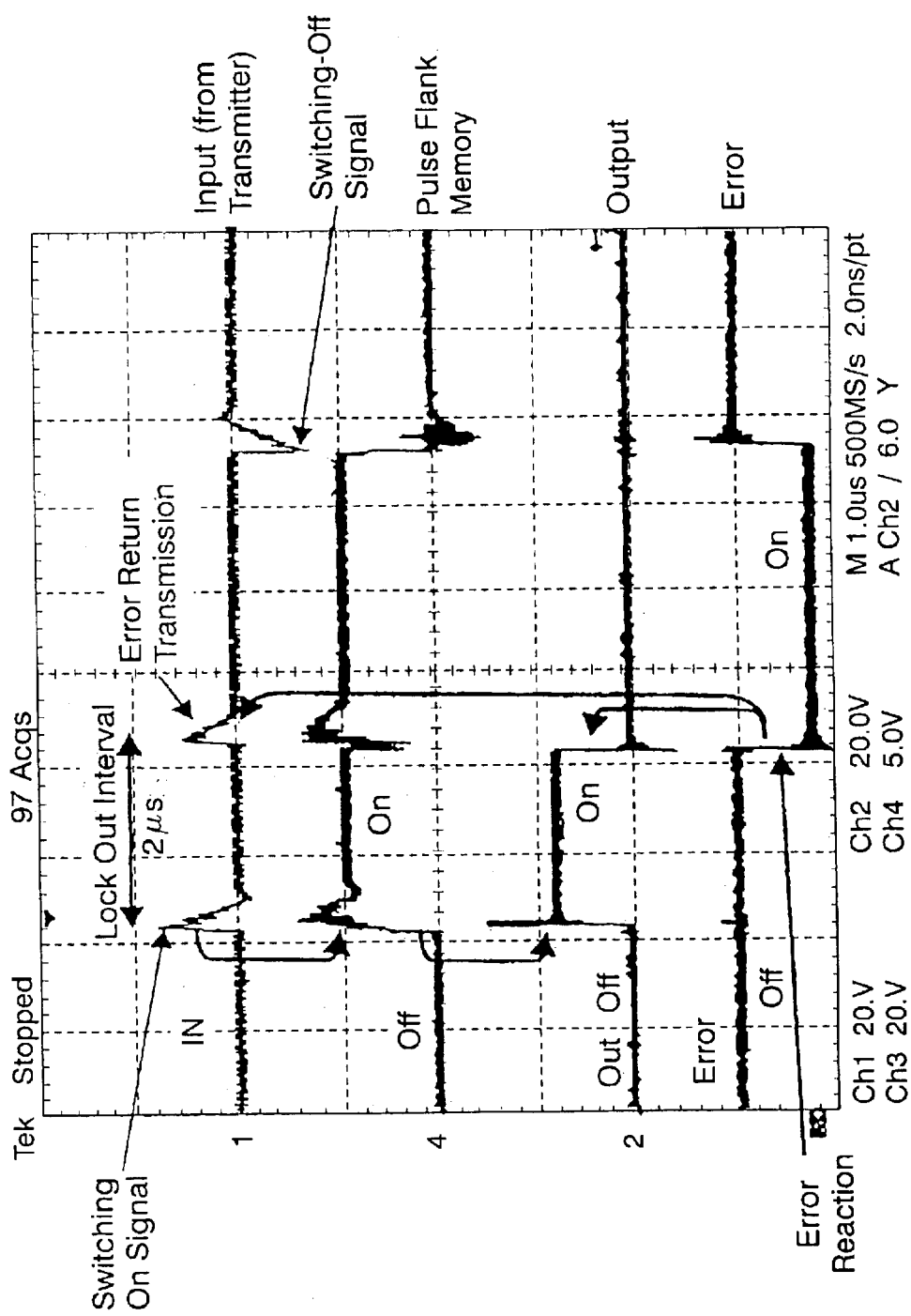
FIG. 6 shows a graph of signals measured for the detection and processing of errors.
Figure 7:
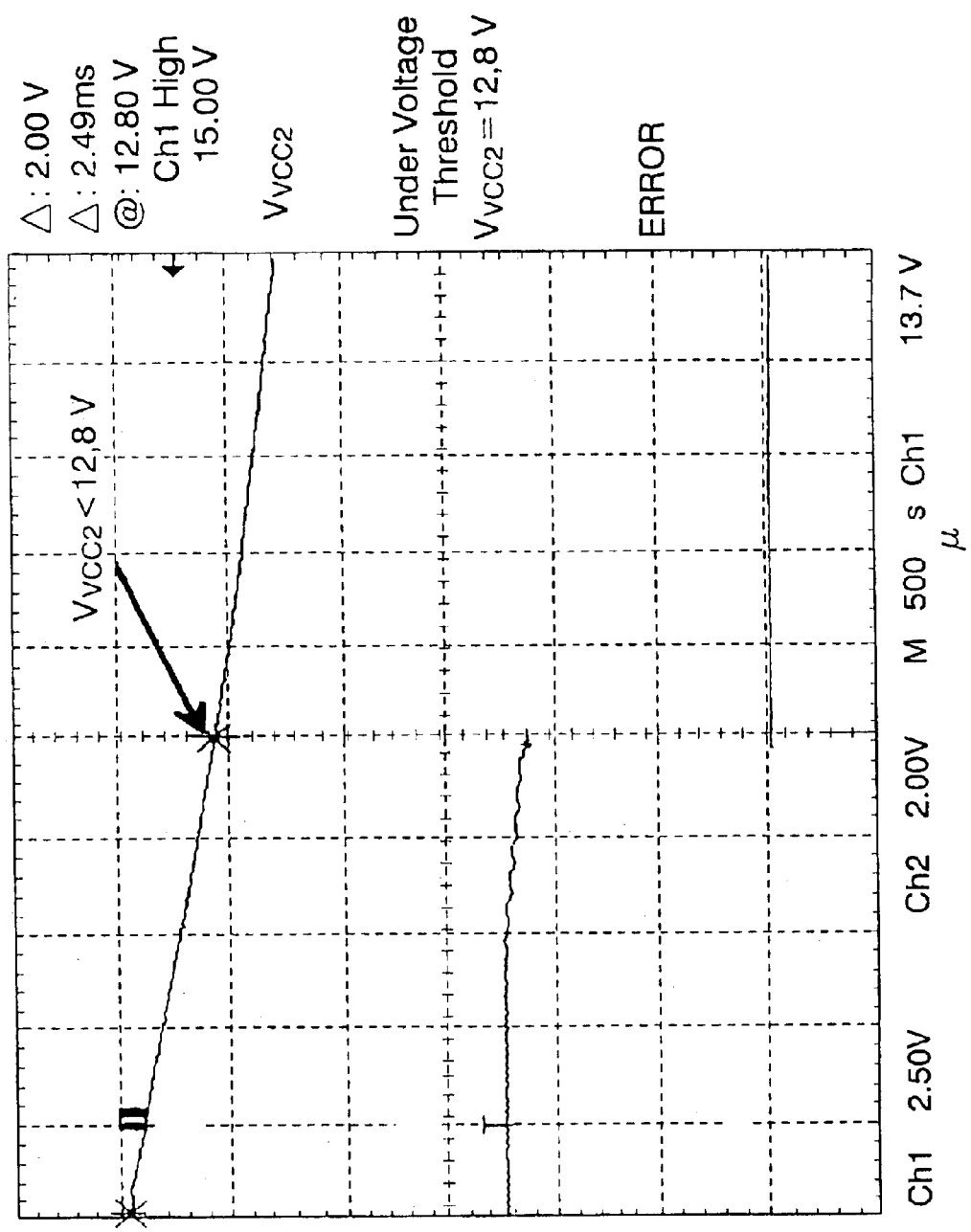
FIG. 7 represents an example to illustrate how the function of monitoring the operating voltage is performed.

FIGS. 5 to 7 show examples of measurements performed by circuits that have been realized in practice.

FIG. 5 represents the signals from the input to the output as well as the driver capability of the gate drivers. The capacitative charging current $I_{output}$ amounts to approximately 3 ampere for the indicated values of the test circuit (RG=4,75Ω, CL=33 nF).

FIG. 6 shows the measurements for the switching-on and switching-off in case of an error. The $V_{CE}$ detection is performed by connecting the IGBT collector directly to the respective gate driver by way of an appropriate high-voltage diode. After a certain dead time has elapsed following the switching-on (2 μs in the illustrated case) the pass-through voltage at the IGBT should have dropped below a threshold value. If this is not the case (as in FIG. 6) a short-circuit exists at the IGBT, and the IGBT is switched off (see channel 3 [with a "hard" switching-off at the output] and channel 4 [error memory set]). The error is transmitted to the primary side (channel 1), generating a switching-off signal for all gate drivers (channel 1), which resets the error memory on the secondary side (channel 4).

FIG. 7 illustrates through an example how the function of monitoring the operating voltage is performed. For the 15V operating voltage (VD+, VCC2), the error threshold lies at approximately 12, 8V (above VE); for the internally generated 5V voltage (VDD), the threshold lies at approximately 3, 0V (above VD−; not shown in the graph).

Figure 8:
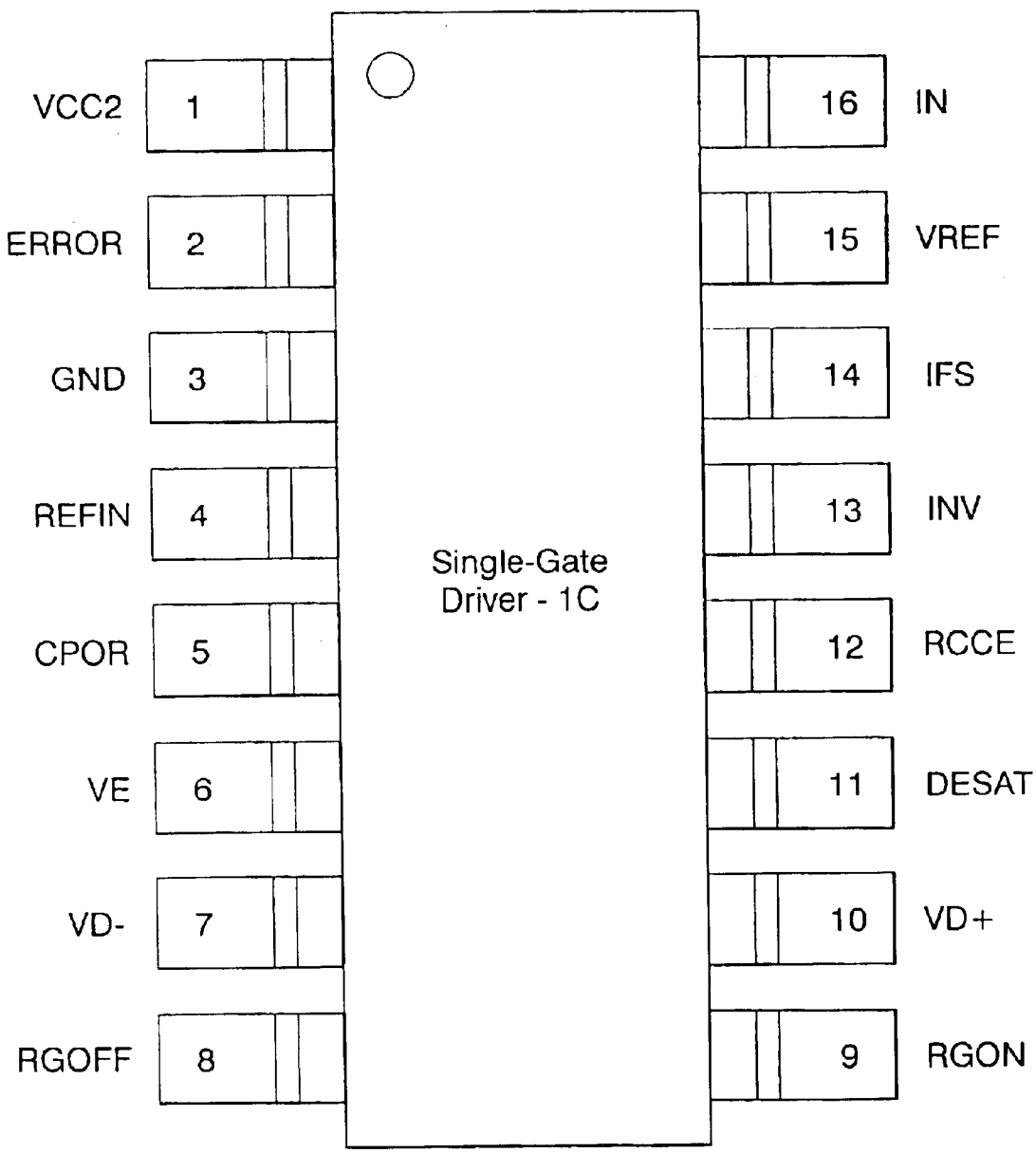
FIG. 8 illustrates the pin allocation for a single-gate driver IC according to the invention hrough the example of a 16-pin small-outline package (SOP 16).

FIG. 8 illustrates the allocation of the connector terminals of a single-gate driver IC through the example of a 16-pin small-outline package (SOP 16). Table 1 defines the inputs and outputs of the IC of FIG. 8.

In comparison to hybrid or discrete solutions, the controller IC has the advantages of a high integration density of various digital-, analog-, and driver functions, so that the circuit has fewer discrete elements and, as a consequence, the failure rate of the system is decreased and the cost is reduced. Another important aspect is the improvement of the circuit characteristics by the monolithic integration. The integrated circuit is less sensitive to interference voltages and temperature drift in comparison to circuits that are assembled from discrete components.

List of Symbols Used in FIGS. 1 to 4

1 controller
2 control circuit (primary side)
3 potential separation between primary and secondary side
4 driver circuit
5 intermediate voltage circuit
6 power switch
7 consumer device
8 sensors with signal-processing circuit circuit
9 intermediate circuit
10 control circuit (primary side)
11 single-gate driver IC
12a input interface (Schmitt trigger)
12b pulse-flank memory
13 level conversion
14 level conversion
15 POR (Power-On-Reset)
16 driver logic
17 driver stage on
18 driver stage off
19 $V_{DD}$/VREF—generation
20 $U_B$—monitoring
21 $V_{CE}$—detection
22 error memory
23 driver for error transmission

TABLE 1

Pin allocation of SOP 16 module (FIG. 8)

| Pin | Symbol | Description |
|---|---|---|
| 1 | VCC2 | operating voltage 15 V |
| 2 | ERROR | output for error message |
| 3 | GND | reference potential |
| 4 | REFIN | connection to external reference voltage |
| 5 | CPOR | setting of Power-On-Reset, stabilization of internal supply voltage |

TABLE 1-continued

Pin allocation of SOP 16 module (FIG. 8)

| Pin | Symbol | Description |
|---|---|---|
| 6 | VE | reference potential, emitter potential of the IGBT |
| 7 | VD− | operating voltage for switching-off of the IGBT (variable 0 V . . . −15 V) |
| 8 | RGOFF | output of RGOFF of the IGBT |
| 9 | RGON | output of RGON of the IGBT |
| 10 | VD+ | operating voltage for switching-on of the IGBTs |
| 11 | DESAT | connection to high-voltage diode for VCE monitoring of the IGBT |
| 12 | RCCE | setting of the dynamic $V_{CE}$ - monitoring |
| 13 | INV | input for inverting the driver outputs RGON and RGOFF |
| 14 | IFS | output pulse-flank memory |
| 15 | VREF | stabilization of the internal reference potential |
| 16 | IN | reference input IGBT, high active |

What is claimed is:

1. A semiconductor component for the control of a power semiconductor switch in a power inverter, said semiconductor component comprising a monolithically integrated circuit composed of functional blocks, including:

input interface with Schmitt trigger, pulse flank memory, multiple level converters, start-up logic with voltage-controlled power on reset, driver logic, gate driver for switching-on of the power semiconductor switch, gate driver for switching-off of the power semiconductor switch, gate driver for gentle switching-off of the power semiconductor switch, circuit portion for internal generating and monitoring of an operating voltage and reference voltage, circuit portion for short-circuit monitoring of the power semiconductor switch by dynamic collector-emitter voltage detection, circuit portion for error detection/storage, and driver for transmission of the error signal to a primary side of the semiconductor component.

2. The semiconductor component of claim 1, wherein the power semiconductor switch comprises one of an insulated gate bipolar transistor and a metal oxide semiconductor field effect transistor.

3. The semiconductor component of claim 1, comprising a monolithically integrated gate driver operable for direct control and monitoring of power switches in a voltage range from 600 volt to 1700 volt at currents up to and exceeding 200 ampere, in circuit topologies including a single switch, a half bridge, an H-bridge, a three-phase bridge, and a brake setter.

4. The semiconductor component of claim 1, further comprising:

an error memory;

a signal-processing part that includes the input interface with Schmitt trigger and the pulse-flank memory, wherein the input interface receives an input signal and performs short-pulse suppression for interference signals, a first level converter which converts an input signal level to an internal signal level of the semiconductor component, the driver logic creates a logic correlation between the input signal, the error memory, and the power-on-reset, and a second level converter connected to the driver performs level shifts to voltage levels not exceeding +/−b 15V at an output side of the semiconductor component.

5. The semiconductor component of claim 1, wherein the internal generation of an operating voltage produces a constant DC voltage, said constant DC voltage being defined relative to a reference potential represented by an externally supplied variable operating voltage for the switching-off of the power semiconductor switch.

6. The semiconductor component of claim 1, wherein the internal monitoring of an operating voltage comprises monitoring of operating voltages and reference voltages that are externally supplied as well as internally generated, and wherein the power semiconductor switch is switched off in a defined manner, when an under-voltage is detected by said monitoring.

7. The semiconductor component of claim 1, wherein the short-circuit monitoring of the power semiconductor switch by dynamic collector-emitter voltage detection comprises evaluating the collector-emitter voltage as a function of time, and wherein switch-off thresholds $V_{CESat}$ for the collector-emitter voltage and for a time interval $t_{min}$ can be adapted for specific applications through application-specific external circuit elements.

8. The semiconductor component of claim 1, wherein during a start-up of the inverter, the start-up logic safely prevents a short circuit by not releasing the gate driver for switching-on of the power semiconductor circuit unless and until all operating threshold voltages have been reached, and wherein the start-up logic independently resets flags for error conditions that were detected during start-up.

9. The semiconductor component of claim 1, wherein when an operating error is detected by at least one of the $V_{CE}$-monitoring, operating-voltage monitoring, and reference-voltage monitoring functions, the power semiconductor switch is switched off and an error signal is transmitted through an integrated driver stage to a control circuit on the primary side of the semiconductor component, which initiates switching off other power semiconductor switches.

10. The semiconductor component of claim 1, wherein said gates drivers for controlling a gate of the power semiconductor, wherein said gate driver for switching-on of the power semiconductor switch comprise a p-MOSFET for a fast switching-on, said gate driver for switching-off comprises a first n-MOSFET with a first current-carrying capacity for a fast switching-off, and said gate driver for gentle switching-off comprises a second n-MOSFET with a second current-carrying capacity for a gentle switching-off in case of a short circuit, said second current-carrying capacity amounting to only a fraction of said first current-carrying capacity.

11. The semiconductor component of claim 10, wherein a voltage of said gate driver for gentle switching-off is monitored, and when the voltage falls below a defined voltage threshold, the gentle switching-off is changed to the fast-switching-off in order to shorten the switching-off process.

12. The semiconductor component of claim 1, further comprising an error memory, wherein following detection of an error and sending a reset signal to the primary side of the semiconductor component, the error memory is erased and a controlled restart of the gate driver for switching on is initiated, when there is no longer an error present in the operating voltages.

* * * * *

UNITED STATES PATENT AND TRADEMARK OFFICE
CERTIFICATE OF CORRECTION

PATENT NO.    : 6,741,116 B2
DATED         : May 25, 2004
INVENTOR(S)   : Reinhard Herzer et al.

It is certified that error appears in the above-identified patent and that said Letters Patent is hereby corrected as shown below:

<u>Title page,</u>
Item [75], Inventors, delete "Jurgen Masannek, Nuremberg (DE)" and substitute -- Jurgen Masannek, Nurnberg (DE) --.
Item [73], Assignee, delete "Semikron Elekronik GmbH, Nuremberg (DE)" and substitute -- Elektronik GmbH, Nurnberg, (DE) --.

Signed and Sealed this

Thirty-first Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,741,116 B2
DATED : May 25, 2004
INVENTOR(S) : Reinhard Herzer et al.

It is certified that error appears in the above-identified patent and that said Letters Patent is hereby corrected as shown below:

Title page,
Item [75], Inventors, delete "Jurgen Masannek, Nuremberg (DE)" and substitute -- Jurgen Masannek, Nurnberg (DE) --.
Item [73], Assignee, delete "Semikron Elekronik GmbH, Nuremberg (DE)" and substitute -- SemiKron Elektronik GmbH, Nurnberg, (DE) --.

This certificate supersedes Certificate of Correction issued August 31, 2004.

Signed and Sealed this

Twenty-second Day of March, 2005

JON W. DUDAS
*Director of the United States Patent and Trademark Office*